(12) United States Patent
Zhang et al.

(10) Patent No.: US 10,943,669 B2
(45) Date of Patent: Mar. 9, 2021

(54) MEMORY SYSTEM AND METHOD FOR OPTIMIZING READ THRESHOLD

(71) Applicant: SK HYNIX INC., Gyeonggi-Do (KR)

(72) Inventors: Fan Zhang, San Jose, CA (US); Yu Cai, San Jose, CA (US); Chenrong Xiong, San Jose, CA (US); Xuanxuan Lu, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/519,445

(22) Filed: Jul. 23, 2019

(65) Prior Publication Data
US 2020/0027519 A1 Jan. 23, 2020

Related U.S. Application Data

(60) Provisional application No. 62/702,082, filed on Jul. 23, 2018.

(51) Int. Cl.
G06F 3/06 (2006.01)
G11C 29/38 (2006.01)

(52) U.S. Cl.
CPC ............ G11C 29/38 (2013.01); G06F 3/0619 (2013.01); G06F 3/0659 (2013.01); G06F 3/0673 (2013.01)

(58) Field of Classification Search
CPC ....... G11C 29/38; G11C 29/021; G11C 29/52; G11C 29/028; G11C 16/26; G11C 16/0483; G06F 3/0673; G06F 3/0659; G06F 3/0619; G06F 3/064; G06F 3/0679
See application file for complete search history.

(56) References Cited

U.S. PATENT DOCUMENTS

| | | | |
|---|---|---|---|
| 2011/0063918 A1* | 3/2011 | Pei ..................... | G11C 16/3418 365/185.18 |
| 2011/0131375 A1* | 6/2011 | Noeldner .................. | G06F 3/00 711/114 |
| 2011/0161775 A1* | 6/2011 | Weingarten ............ | G11C 16/26 714/755 |
| 2014/0229131 A1* | 8/2014 | Cohen ..................... | G11C 16/26 702/64 |
| 2015/0378801 A1* | 12/2015 | Navon ................. | G11C 16/349 714/704 |
| 2018/0046527 A1 | 2/2018 | Reusswig et al. | |
| 2018/0158493 A1 | 6/2018 | Ryu | |

* cited by examiner

Primary Examiner — Albert Decady
Assistant Examiner — Enam Ahmed
(74) Attorney, Agent, or Firm — IP & T Group LLP

(57) ABSTRACT

A memory system includes a memory device and a controller. The controller performs a test read operation on a read data set of the memory device, using multiple read threshold entries and determines which are good read threshold entries based on results of the read operation. The controller selects a best read threshold entry among the multiple read threshold entries based on a result of the test read operation, partitions the read data set into a good data set decodable by the best read threshold entry and a bad data set undecodable by the best read threshold entry, and sets the bad data set as a new read data set.

10 Claims, 8 Drawing Sheets

MEMORY SYSTEM AND METHOD FOR OPTIMIZING READ THRESHOLD

CROSS-REFERENCE TO RELATED APPLICATION

This application claims the benefit of U.S. Provisional Application No. 62/702,082, filed on Jul. 23, 2018, the entire contents of which are incorporated herein by reference.

BACKGROUND

1. Field

Embodiments of the present disclosure relate to a scheme for processing read threshold values for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various kinds of encoder.

SUMMARY

Aspects of the present invention include a memory system and a method for processing read threshold values, capable of improving quality of service (QoS) of the memory system.

In one aspect, a memory system includes a memory device and a controller. The controller performs a test read operation on a read data set of the memory device, using multiple read threshold entries and determines good read threshold entries among the multiple read threshold entries based on results of the test read operation. The controller selects a best read threshold entry among the multiple read threshold entries based on a result of the test read operation, partitions the read data set into a good data set that includes data in the read data set that is decodable by the best read threshold entry and a bad data set that includes data in the read data set that is undecodable by the best read threshold entry, and sets the bad data set as a new read data set.

In another aspect, a method for operating a memory system includes performing a test read operation on a read data set of the memory device, using multiple read threshold entries, and determining good read threshold entries among the multiple read threshold entries based on results of the test read operation. The determining of the good read threshold entries includes: selecting a best read threshold entry among the multiple read threshold entries based on a result of the test read operation; partitioning the read data set into a good data set that includes data in the read data set that is decodable by the best read threshold entry and a bad data set that includes data in the read data set that is undecodable by the best read threshold entry; and setting the bad data set as a new read data set.

Additional aspects of the present invention will become apparent from the following description.

DETAILED DESCRIPTION

Figure 1:
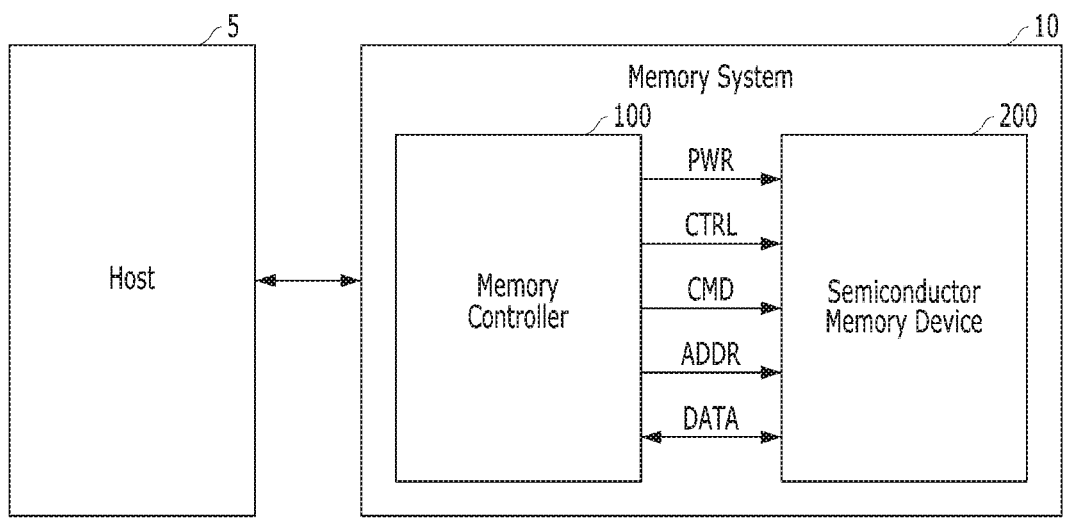
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring to FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
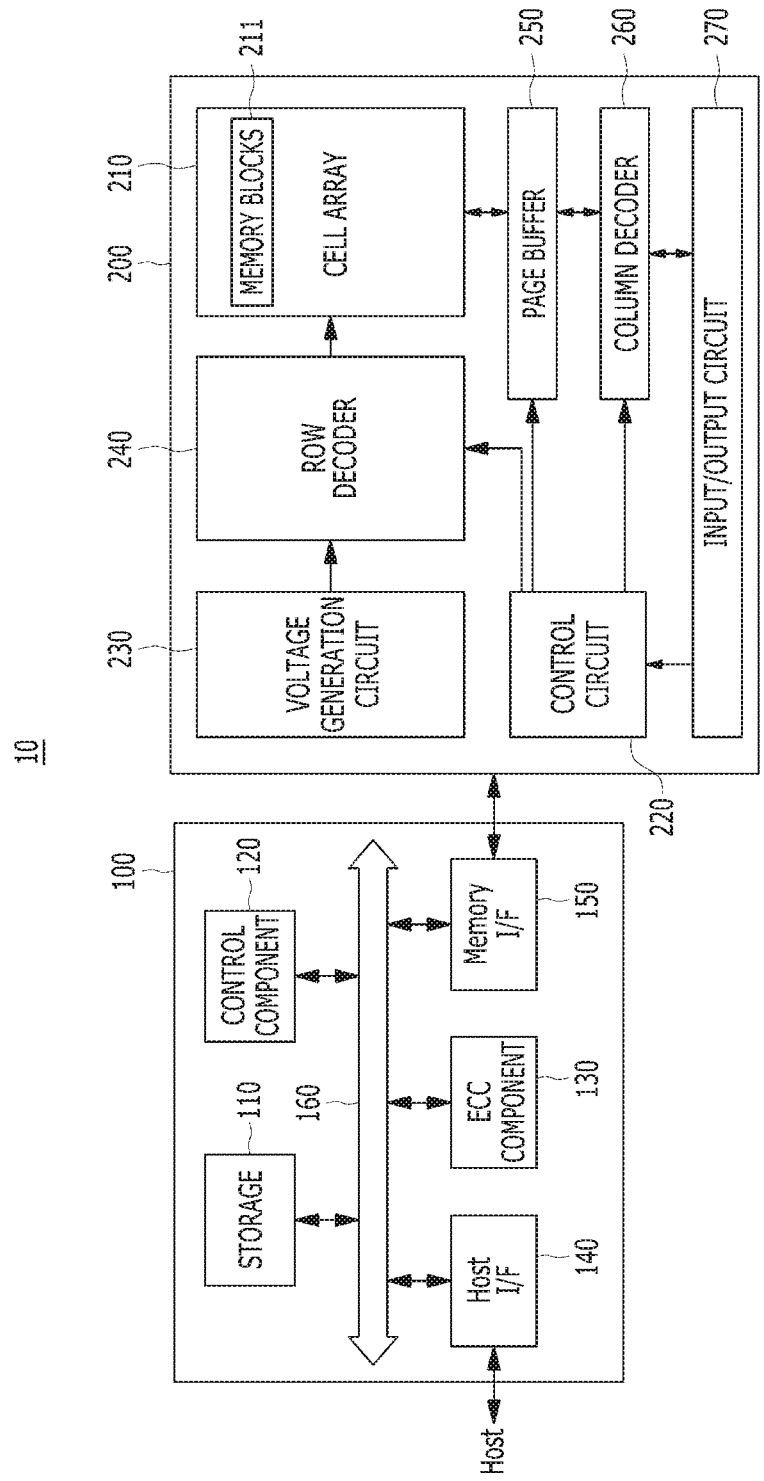
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
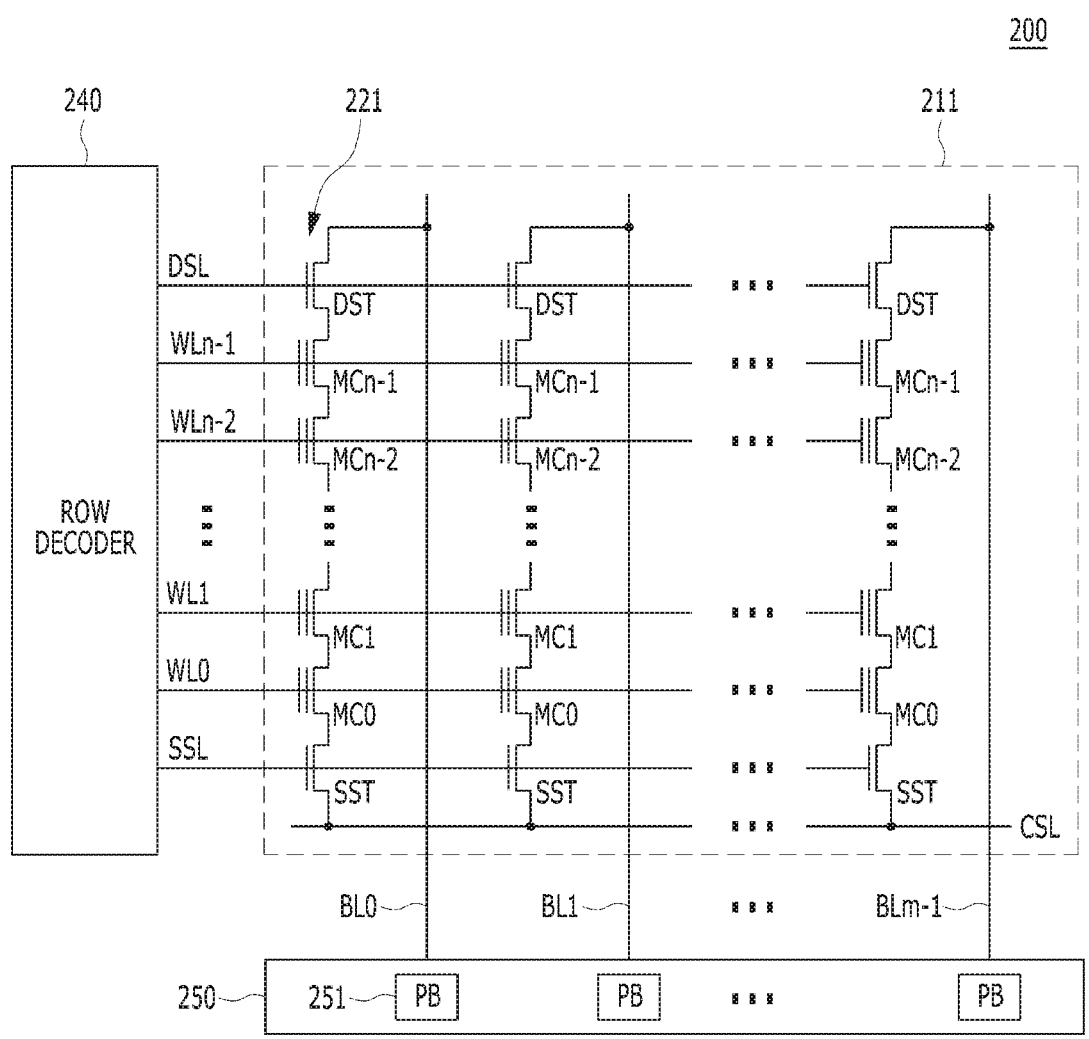
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 and also transmit data to, and receive data from, the input/output circuit 270.

The input/output circuit 270 may transmit to the control circuit 220 a command and an address received from an external device (e.g., the memory controller 100 of FIG. 1), transmit data from the external device to the column decoder 260, or output data from the column decoder 260 to the external device through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as any of various cells configured with different data storage capacities. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In a memory system such as a solid state drive (SSD), data for storage in a memory device may be striped across different dies and/or different planes through different channels. For this processing, a super block may be generated, which includes physical blocks with the same block index across different channels, dies and possibly different planes.

Figure 4:
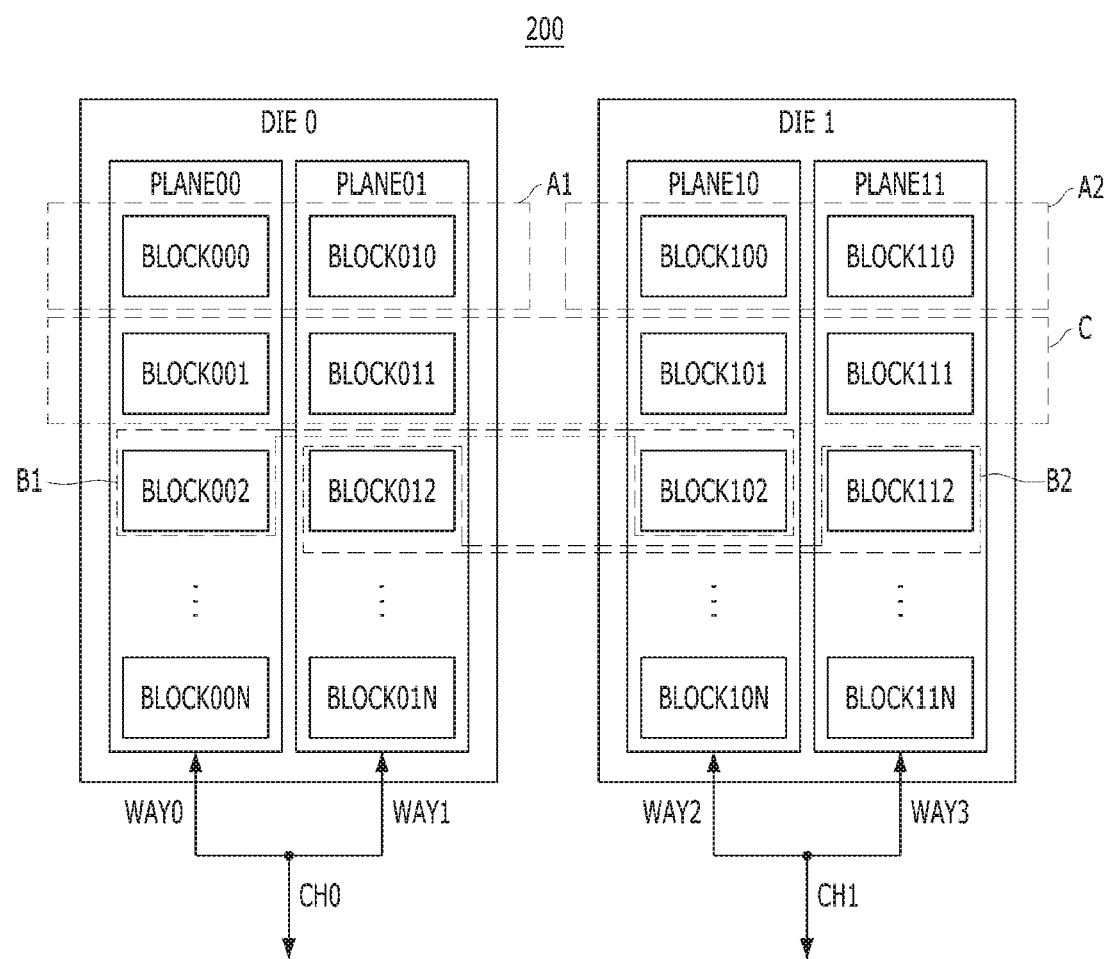
FIG. 4 is a diagram illustrating the concept of a super memory block in a memory device in accordance with an embodiment of the present invention.

FIG. 4 is a diagram illustrating the concept of a super memory block in a memory device 200 in accordance with an embodiment.

Referring to FIG. 4, the memory device 200 may include a plurality of dies. Each of the plurality of dies may include a plurality of planes. Each of the plurality of planes may include a plurality of memory blocks.

The memory device 200 includes a plurality of memory blocks BLOCK000 to BLOCK00N, BLOCK010 to BLOCK01N, BLOCK100 to BLOCK10N, and BLOCK110 to BLOCK11N.

The memory device 200 includes a zeroth memory die DIE0 capable of receiving and outputting data through a zeroth channel CH0 and a first memory die DIE1 capable of receiving and outputting data through a first channel CH1. The zeroth channel CH0 and the first channel CH1 may receive and output data in an interleaving scheme.

The zeroth memory die DIE0 includes a plurality of planes, e.g., PLANE00 and PLANE01, respectively corresponding to a plurality of ways, e.g., WAY0 and WAY1, capable of receiving and outputting data in the interleaving scheme by sharing the zeroth channel CH0.

The first memory die DIE1 includes a plurality of planes, e.g., PLANE10 and PLANE11, respectively corresponding to a plurality of ways, e.g., WAY2 and WAY3, capable of receiving and outputting data in the interleaving scheme by sharing the first channel CH1.

The first plane PLANE00 of the zeroth memory die DIE0 includes a set or predetermined number of memory blocks BLOCK000 to BLOCK00N, among all of the plurality of memory blocks.

The second plane PLANE01 of the zeroth memory die DIE0 includes the set or predetermined number of memory blocks BLOCK010 to BLOCK01N, among all of the plurality of memory blocks.

The first plane PLANE10 of the first memory die DIE1 includes the set or predetermined number of memory blocks BLOCK100 to BLOCK10N, among all of the plurality of memory blocks.

The second plane PLANE11 of the first memory die DIE1 includes the set or predetermined number of memory blocks BLOCK110 to BLOCK11N, among all of the plurality of memory blocks.

In this manner, the plurality of memory blocks of the memory device 200 may be divided according to physical positions such that blocks in the same plane use the same way and blocks in the same die use the same channel.

While it is illustrated in FIG. 4 that the memory device 200 includes two dies, each of which include two planes, this is merely an example. The memory device 200 may be configured with any suitable number of dies based on design and operational considerations, and the number of planes in each memory die may likewise be different than in the example shown in FIG. 4. Of course, the set or predetermined number of memory blocks in each plane also may be different depending on design and operational considerations.

Alternatively, instead of dividing the memory blocks according to physical positions, the controller 100 may divide the memory blocks according to simultaneous selection and operation of memory blocks. That is, the controller 100 may manage a plurality of memory blocks by grouping memory blocks capable of being selected simultaneously and thereby dividing the plurality of memory blocks into super memory blocks.

The plurality of memory blocks may be grouped or divided into super memory blocks by the controller 100 according to various schemes depending on design considerations. Three exemplary schemes are described herein.

In accordance with a first scheme, the controller 100 may generate and manage one super memory block A1 in the memory device 200 by grouping one memory block BLOCK000 in the first plane PLANE00 of the zeroth memory die DIE0 and one memory block BLOCK010 in the second plane PLANE01 of the zeroth memory die DIE0. Also, the controller 100 may generate and manage another super memory block A2 by grouping one memory block BLOCK100 in the first plane PLANE10 and one memory block BLOCK110 in the second plane PLANE11.

In accordance with a second scheme, the controller 100 may generate and manage one super memory block B1 to include memory block BLOCK002 in the first plane PLANE00 of the zeroth memory die DIE0 and one memory block BLOCK102 in the first plane PLANE10 of the first memory die DIE1. Also, the controller 100 may generate and manage another super memory block B2 by grouping one memory block BLOCK012 in the second plane PLANE01 of the zeroth memory die DIE0 and one memory block BLOCK112 in the second plane PLANE11 of the first memory die DIE1. Thus, while the first scheme groups two memory blocks from two different planes in the same die into a super block, the second scheme groups one block from each of the different dies into a super block. The methodology of either scheme may be extended to apply to arrangements of more than two dies and more than two planes in a die.

In accordance with a third scheme, the controller 100 may generate and manage one super memory block C by grouping one memory block BLOCK001 in the first plane PLANE00 of the zeroth memory die DIE0, one memory block BLOCK011 in the second plane PLANE01 of the zeroth memory die DIE0, one memory block BLOCK101 in the first plane PLANE10 of the first memory die DIE1 and one memory block BLOCK111 included in the second plane PLANE11 of the first memory die DIE1 Thus, in accordance with the third scheme, four blocks, from each plane in each die, are grouped to form a super block. The third scheme may also be extended to apply to more complex die/plane arrangements.

Generally, a storage device manufacturing company has to make sure that its storage devices, such as solid state drives (SSDs), can meet all the requirements in their respective specifications for the life of the respective storage devices. If a particular storage device deviates from its specification, the customer or user may consider that such device is reaching its end of life (EOL), and replace it. In enterprise SSDs, quality of service (QoS) is considered as the EOL limiting factor. When an enterprise SSD is approaching its EOL, most customers or users will see the QoS violation. QoS requirement is defined as the maximum latency for different percentages of read and/or write commands to be completed and returned to a host. The requirements on low 9's such as 90%, 99%, or 99.9% are often referred to as low-9 QoS requirements. The latency at low-9's is often determined by the probability of failure of default read, historical read, and high priority read retry reads. The probability of failure depends on an error correction code (ECC) engine and the fail-bit (FB) distribution of a memory device (e.g., NAND). Although the ECC engine does not change the lifespan of an SSD, the FB distribution may significantly shorten the lifespan of the SSD depending on an operation condition of the SSD.

Thus, embodiments of the present invention provide a scheme to improve QoS of a storage device such as an SSD by controlling the FB distribution of a memory device through the optimization of read threshold values. In various embodiments, read threshold values for one or more default reads, one or more historical reads and one or more read retries may be contained in and referred to collectively as a read level table (RLT). Various embodiments provide a scheme to optimize the RLT on the fly.

Figure 5:
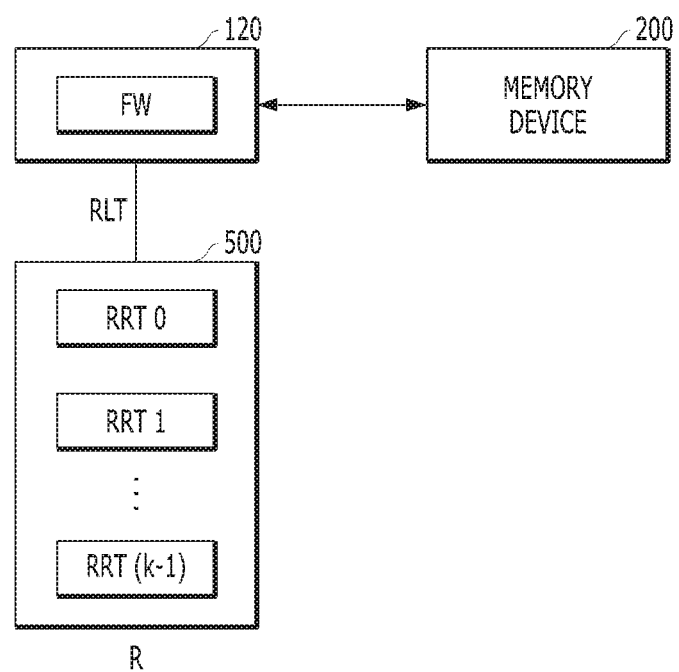
FIG. 5 is a diagram illustrating a memory system in accordance with an embodiment of the present invention.

FIG. 5 is a diagram illustrating a memory system in accordance with an embodiment of the present invention.

Referring to FIG. 5, the memory system may include a control component 120, a memory device 200 and a memory 500. For example, the control component 120, the memory device 200 and the memory 500 of FIG. 5 may be implemented as the components of the memory system 10 shown in FIG. 2. In other words, the control component 120 and the memory 500 may be components of the controller 100 in FIG. 2.

The memory 500 may include a read threshold value set R including a plurality of read threshold values, e.g., k read threshold values RRT0 to RRT(k−1).

The control component 120 may include firmware (FW). The firmware may maintain a read level table (RLT) for every super block. Thus, different super blocks may be running the same scheme and maintaining their own version of RLT. The RLT may include multiple entries, and the firmware may consider a default read as the first entry of the RLT, a historical read as the second entry of the RLT and a first read retry as third entry of RLT. The RLT may depend on super block index, and NAND condition such as program erase count (PEC), single page read (SPRD), and retention. To optimize and update the RLT according to NAND condition, the firmware may schedule some test reads in the background. In order to reduce the impact on read performance and latency, the test reads may be interleaved with normal reads from a host (i.e., host reads) by a certain ratio, for example 1:1000. In other words, the test read operation may be interleaved with a ratio lower than that of the normal read operation. When there is a host read command, the firmware may determine in which super block the requested data is located and use the corresponding RLT to read the data from the memory device (e.g., NAND) 200.

In various embodiments, the control component 120 may perform a test read operation on a read data set of the memory device, using multiple read threshold entries, and determine good read threshold entries among the multiple read threshold entries based on results of the read operation. To determine the good read threshold entries, the control component 120 may select a best read threshold entry among the multiple read threshold entries based on a result of the test read operation, partition the read data set into a good data set decodable by the best read threshold entry and a bad data set undecodable by the best read threshold entry, and set the bad data set as a new read data set.

In various embodiments, the control component 120 may perform the test read operation by reading data from the new read data set, using remaining read threshold entries, which excludes the best read threshold entry previously used.

In various embodiments, the result of the test read operation may include the numbers of fail bits for the read data set.

In various embodiments, the read data set may correspond to physical addresses selected from a super block of the memory device.

In various embodiments, the control component 120 may further perform a normal read operation on the memory device in response to a read command from a host, using the good read threshold entries.

Figure 6A:
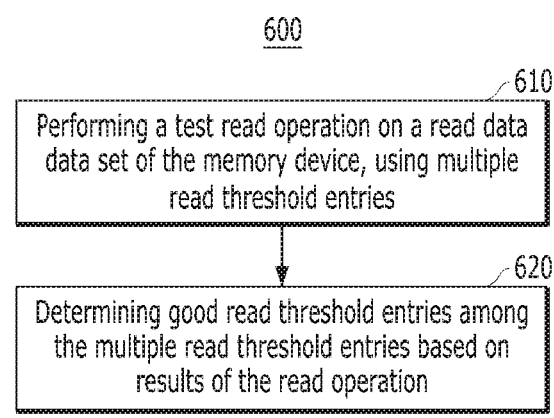
FIGS. 6A and 6B are flowcharts illustrating a method for managing a read level table (RTL) in accordance with an embodiment of the present invention.
Figure 6B:
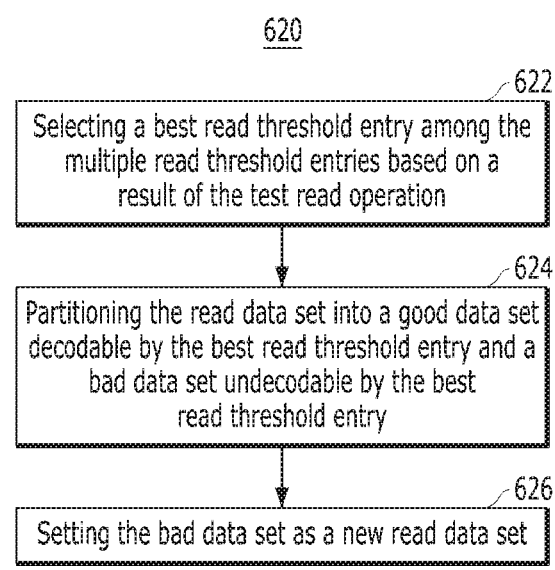

FIGS. 6A and 6B are flowcharts illustrating a method 600 for managing a read level table (RLT) in accordance with an embodiment of the present invention.

Referring to FIG. 6A, the method 600 may include operations 610 and 620. The operation 610 may include performing a test read operation on a read data set of a memory device, using multiple read threshold entries. The operation 620 may include determining good read threshold entries among the multiple read threshold entries based on results of the read operation.

In various embodiments, the method 600 may further include performing a normal read operation on the memory device in response to a read command from a host, using the good read threshold entries.

In various embodiments, individual reads of the test read operation are interleaved with individual reads of a normal read operation at a certain ratio. That is, a lower percentage of test reads are performed as compared to normal reads, for example, at a ratio of 1:100.

Referring to FIG. 6B, the operation 620 may include operations 622, 624 and 626. The operation 622 may include selecting a best read threshold entry among the multiple read threshold entries based on a result of the test read operation. The operation 624 may include partitioning the read data set into a good data set decodable by the best read threshold entry and a bad data set undecodable by the best read threshold entry. The operation 626 may include setting the bad data set as a new read data set.

In various embodiments, the operation 610 may include reading data from the new read data set, using remaining read threshold entries, which excludes the best read threshold entry among multiple read threshold entries.

In various embodiments, the result of the test read operation includes the numbers of fail bits for the read data set.

In various embodiments, the read data set corresponds to physical addresses selected from a super block of the memory device.

Figure 7:
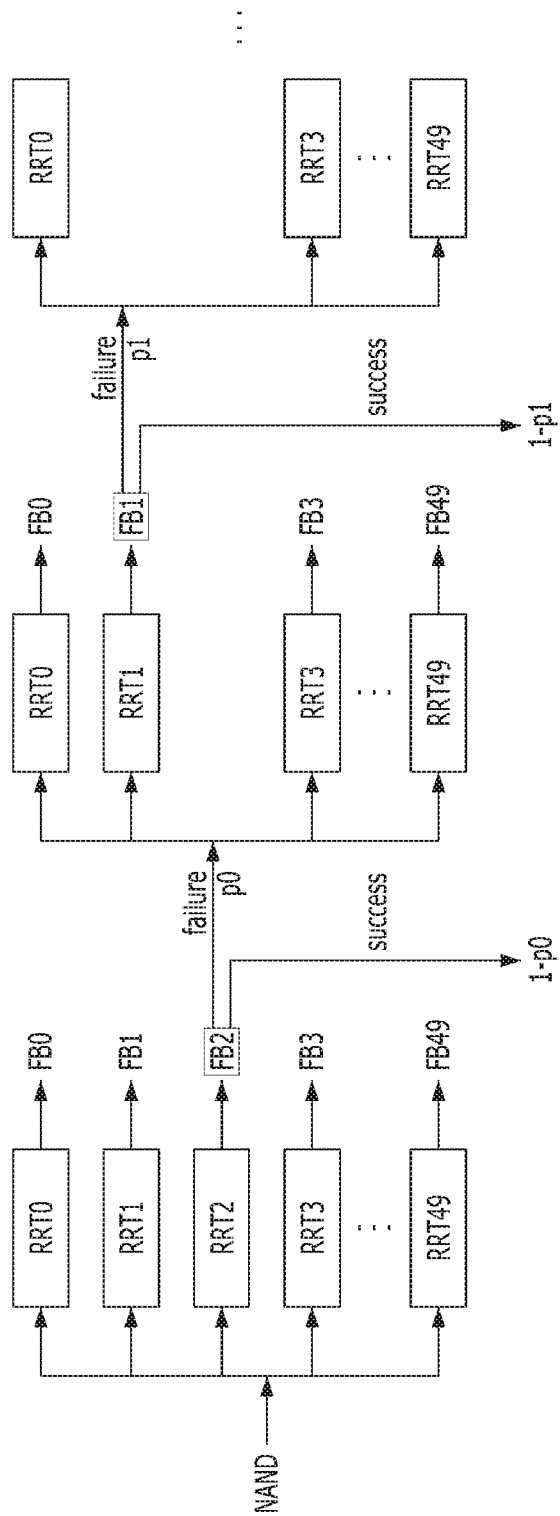
FIG. 7 is a diagram illustrating an example of an optimization process of a read level table (RTL) in accordance with an embodiment of the present invention.

FIG. 7 is a diagram illustrating an optimization process of a read level table (RTL) in accordance with an embodiment of the present invention. For example, the optimization process may be performed by the control component 120 of FIG. 5.

Referring to FIG. 7, a read threshold value set R including different read threshold values, for example, RRT0 to RRT49, may be defined for each super block of a memory device (e.g., NAND).

The read level table (RLT) may be optimized from the read threshold value set R. In other words, the RLT may be a subset of the read threshold value set R={RRT0, RRT1, . . . , RRT49}. For example, the optimization of the RLT may include identifying the 5 best RRTs from the set R. The optimality may be defined by the fail-bit (FB) counts of the RRTs, in which smaller the better. The optimization process may be performed by the steps as shown in the following:

---
Step 0: Set read data set D=S, set i=0.
Step 1: Read data from D using R.
Step 2: Identify the best RRT entry from R as RLT(i).
Step 3: Partition D into good set G(i) and bad set B(i).
Set D=B(i), set R=R−RLT(i) and set i=i+1.
Step 4: If D is empty, go to step 0.
Else if i<=4 go back to step 1.
Otherwise exit.
---

At step 0, for every super block, the control component 120 may set a data set D corresponding to physical addresses of the memory device, which are associated with a test read, as total test set S. The set S may be either predefined or decided on the fly. As a result, a read data set D may be defined. Further, the control component 120 may set a variable i to zero (0).

At step 1, the control component 120 may read data from the read data set D sequentially using RRTs in the read threshold value set R.

At step 2, the control component 120 may identify the best RRT entry in the read threshold value set R and define the best RRT entry as RLT(i).

At step 3, the control component 120 may partition the read data set D into a good set G(i) and a bad set B(i). The good set means the subset of D that is decodable using RLT(i). The bad set means the subset of D that is not decodable using RLT(i). Also, the control component 120 may set the bad set B(i) as the new read data set, i.e., D=B(i). Further, the control component 120 may set the read threshold value set excluding the best RRT entry RLT(i) as a new read threshold value set, i.e., R=R−RLT(i). Furthermore, the control component 120 may increase the variable, i.e., i=i+1.

At step 4, the control component 120 may determine whether the read data set D is empty. If the read data set D is empty, the control component 120 may proceed to step 0. If the read data set D is not empty, the control component 120 may proceed to step 1. The steps above may be iteratively performed until the variable i=5.

In FIG. 7, by way of examples, it is shown that two best RRTs RRT2 and RRT1 are selected from among 50 RRTs of the set R, based on the FB counts. In other words, first, the RRT2 is selected as the best RRT among 50 RRTs, because a FB count FB2, which corresponds to RRT2, is the lowest among the FB counts FB0 to FB49 corresponding to 50 respective RRTs. In this case, when the read data is decoded using RRT2, the probability of decoding success may be (1−p0) and the probability of decoding failure may be p0. Next, RRT1 is selected as the best RRT among the remaining 49 RRTs (i.e., excluding RRT2), because a FB count FB1, which corresponds to RRT1, is the lowest among the FB counts FB0, FB1, FB3 to FB49 corresponding to 49 respective RRTs. In this case, when the read data is decoded using RRT1, the probability of decoding success may be (1−p1) and the probability of decoding failure may be p1. It is noted that when NAND quality is good, the read data set D may be empty, and the process may not be able to find all 5 RRT entries in the set R. This is acceptable because the first few entries may ensure that data can be decoded successfully. In this case, as described above the process returns to step 0, and repeats until NAND quality deteriorates to a level at which D becomes non-empty.

As described above, the controller in accordance with embodiments may perform on-line read level table optimization to improve the QoS of memory systems such as SSDs. The optimization scheme adapts to changes in NAND quality during its lifetime and ensures QoS throughout the lifetime of the device.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device; and
a controller suitable for:
performing a test read operation on a read data set of the memory device, using multiple read threshold entries; and
determining good read threshold entries among the multiple read threshold entries based on results of the test read operation,
wherein the determining of the good read threshold entries includes:
selecting a best read threshold entry among the multiple read threshold entries, each of which is associated with a failure indicator, based on a result of the test read operation, wherein the best read threshold entry has the lowest failure indicator;
partitioning the read data set into a good data set that includes data in the read data set that is decodable by the best read threshold entry and a bad data set that includes data in the read data set that is undecodable by the best read threshold entry; and
setting the bad data set as a new read data set on which a test read operation is performed using the multiple read threshold entries excluding the best read threshold entry,
wherein the determining, selecting and partitioning operations are repeated with respect to the new read data set.

2. The memory system of claim 1, wherein the result of the test read operation includes numbers of fail bits for the read data set.

3. The memory system of claim 1, wherein the read data set corresponds to physical addresses selected from a super block of the memory device.

4. The memory system of claim 1, further comprising:
performing a normal read operation on the memory device in response to a read command from a host, using the good read threshold entries.

5. The memory system of claim 1, wherein individual reads of the test read operation are interleaved with individual reads of a normal read operation.

6. A method for operating a memory system which includes a memory device, the method comprising:
performing a test read operation on a read data set of the memory device, using multiple read threshold entries; and
determining good read threshold entries among the multiple read threshold entries based on results of the test read operation,
wherein the determining of the good read threshold entries includes:
selecting a best read threshold entry among the multiple read threshold entries, each of which is associated with a failure indicator, based on a result of the test read operation, wherein the best read threshold entry has the lowest failure indicator;
partitioning the read data set into a good data set that includes data in the read data set that is decodable by the best read threshold entry and a bad data set that includes data in the read data set that is undecodable by the best read threshold entry; and
setting the bad data set as a new read data set on which a test read operation is performed using the multiple read threshold entries excluding the best read threshold entry,
wherein the determining, selecting and partitioning operations are repeated with respect to the new read data set.

7. The method of claim 6, wherein the result of the test read operation includes numbers of fail bits for the read data set.

8. The method of claim 6, wherein the read data set corresponds to physical addresses selected from a super block of the memory device.

9. The method of claim 6, further comprising:
performing a normal read operation on the memory device in response to a read command from a host, using the good read threshold entries.

10. The method of claim 6, wherein individual reads of the test read operation are interleaved with individual reads of a normal read operation.

* * * * *